(12) United States Patent
Lin

(10) Patent No.: US 6,350,633 B1
(45) Date of Patent: Feb. 26, 2002

(54) SEMICONDUCTOR CHIP ASSEMBLY WITH SIMULTANEOUSLY ELECTROPLATED CONTACT TERMINAL AND CONNECTION JOINT

(76) Inventor: Charles W. C. Lin, 34 Pinewood Grove, Singapore 738290 (SG)

( * ) Notice: Subject to any disclaimer, the term of this patent is extended or adjusted under 35 U.S.C. 154(b) by 0 days.

(21) Appl. No.: 09/643,212

(22) Filed: Aug. 22, 2000

(51) Int. Cl.⁷ .......................... H01L 21/44; H01L 21/48; H01L 21/50

(52) U.S. Cl. ...................... 438/113; 438/106; 438/127; 438/612

(58) Field of Search .................. 438/106, 113, 438/107, 108, 612, 613, 18, 127

(56) References Cited

U.S. PATENT DOCUMENTS

| | | | |
|---|---|---|---|
| 4,955,523 A | 9/1990 | Calomagno et al. | 228/179 |
| 4,970,571 A | 11/1990 | Yamakawa et al. | 357/71 |
| 4,984,358 A | 1/1991 | Nelson | 29/830 |
| 5,074,947 A | 12/1991 | Estes et al. | 156/307.3 |
| 5,106,461 A | 4/1992 | Volfson et al. | 205/125 |
| 5,116,463 A | 5/1992 | Lin et al. | 156/653 |
| 5,137,845 A | 8/1992 | Lochon et al. | 437/183 |
| 5,167,992 A | 12/1992 | Lin et al. | 427/437 |
| 5,196,371 A | 3/1993 | Kulesza et al. | 437/183 |
| 5,209,817 A | 5/1993 | Ahmad et al. | 156/643 |

(List continued on next page.)

FOREIGN PATENT DOCUMENTS

| | | | | |
|---|---|---|---|---|
| EP | 0 718 882 A1 | 6/1996 | ......... | H01L/23/057 |
| WO | WO 97/38563 | 10/1997 | ............ | H05K/1/03 |
| WO | WO 99/57762 | 11/1999 | | |

OTHER PUBLICATIONS

U.S. Application Serial No. 09/120,408, filed Jul. 22, 1998, entitled "Flip Chip Assembly With Via Interconnection".
U.S. Application Serial No. 09/643,214, filed Aug. 22, 2000, entitled "Semiconductor Chip Assembly with Simultaneously Electrolessly Plated Contact Terminal and Connection Joint".
U.S. Application Serial No. 09/643,213, filed Aug. 22, 2000, entitled "Method Of Making A Support Circuit For A Semiconductor Chip Assembly".
U.S. Application Serial No. 09/643,445, filed Aug. 22, 2000, entitled "Method Of Making A Semiconductor Chip Assembly".
Markstein et al., "Controlling the Variables in Stencil Printing," Electronic Packaging & Production, Feb. 1997, pp. 48–56.
Elenius, "Choosing a Flip Chip Bumping Supplier—Technology an IC Package contractor should look for," Advanced Packaging, Mar./Apr. 1998, pp. 70–73.

(List continued on next page.)

Primary Examiner—Kevin M. Picardat
Assistant Examiner—D. M. Collins
(74) Attorney, Agent, or Firm—David M. Sigmond

(57) ABSTRACT

A semiconductor chip assembly includes a semiconductor chip attached to a support circuit. The support circuit includes an insulative base, a conductive trace and a through-hole between its top and bottom surfaces. The through-hole includes a top sidewall portion adjacent to the top surface and a bottom sidewall portion adjacent to the bottom surface. The conductive trace includes a pillar at the top surface and a routing line at the bottom sidewall portion. An electroplated contact terminal on the pillar extends above the base, and an electroplated connection joint in the through-hole contacts the routing line and the pad. Preferably, the connection joint is the only metal in the through-hole. A method of manufacturing the assembly includes simultaneously electroplating the contact terminal and the connection joint.

50 Claims, 6 Drawing Sheets

U.S. PATENT DOCUMENTS

| | | | |
|---|---|---|---|
| 5,237,130 A | 8/1993 | Kulesza et al. | 174/260 |
| 5,260,234 A | 11/1993 | Long | 437/203 |
| 5,261,593 A | 11/1993 | Casson et al. | 228/180.22 |
| 5,275,330 A | 1/1994 | Issacs et al. | 228/180.2 |
| 5,284,796 A | 2/1994 | Nakanishi et al. | 437/183 |
| 5,293,067 A | 3/1994 | Thompson et al. | 257/668 |
| 5,327,010 A | 7/1994 | Uenaka et al. | 257/679 |
| 5,334,804 A | 8/1994 | Love et al. | 174/267 |
| 5,346,750 A | 9/1994 | Hatakeyama et al. | 428/209 |
| 5,355,283 A | 10/1994 | Marrs et al. | 361/760 |
| 5,358,621 A | 10/1994 | Oyama | 205/123 |
| 5,397,921 A | 3/1995 | Karnezos | 257/779 |
| 5,407,864 A | 4/1995 | Kim | 437/203 |
| 5,424,245 A | 6/1995 | Gurtler et al. | 437/183 |
| 5,437,477 A | 8/1995 | Pasch | 361/689 |
| 5,439,162 A | 8/1995 | George et al. | 228/180.22 |
| 5,447,886 A | 9/1995 | Rai | 437/183 |
| 5,454,161 A | 10/1995 | Beilin et al. | 29/852 |
| 5,454,928 A | 10/1995 | Rogers et al. | 205/125 |
| 5,475,236 A | 12/1995 | Yoshizaki | 257/48 |
| 5,477,933 A | 12/1995 | Nguyen | 174/262 |
| 5,478,007 A | 12/1995 | Marrs | 228/180.22 |
| 5,483,421 A | 1/1996 | Gedney et al. | 361/771 |
| 5,484,647 A | 1/1996 | Nakatani et al. | 428/209 |
| 5,487,218 A | 1/1996 | Bhatt et al. | 29/852 |
| 5,489,804 A | 2/1996 | Pasch | 257/778 |
| 5,493,096 A | 2/1996 | Koh | 219/121.71 |
| 5,508,229 A | 4/1996 | Baker | 437/183 |
| 5,525,065 A | 6/1996 | Sobhani | 439/67 |
| 5,536,973 A | 7/1996 | Yamaji | 257/737 |
| 5,542,601 A | 8/1996 | Fallon et al. | 228/119 |
| 5,547,740 A | 8/1996 | Higdon et al. | 428/209 |
| 5,556,810 A | 9/1996 | Fujitsu | 437/209 |
| 5,556,814 A | 9/1996 | Inoue et al. | 437/230 |
| 5,564,181 A | 10/1996 | Dineen et al. | 29/841 |
| 5,572,069 A | 11/1996 | Schneider | 257/690 |
| 5,576,052 A | 11/1996 | Arledge et al. | 427/98 |
| 5,583,073 A | 12/1996 | Lin et al. | 439/183 |
| 5,595,943 A | 1/1997 | Itabashi et al. | 437/230 |
| 5,599,744 A | 2/1997 | Koh et al. | 437/195 |
| 5,611,140 A | 3/1997 | Kulesza et al. | 29/832 |
| 5,611,884 A | 3/1997 | Bearinger et al. | 156/325 |
| 5,613,296 A | 3/1997 | Kurino et al. | 29/852 |
| 5,614,114 A | 3/1997 | Owen | 219/121.66 |
| 5,615,477 A | 4/1997 | Sweitzer | 29/840 |
| 5,619,791 A | 4/1997 | Lambrecht, Jr. et al. | 29/852 |
| 5,627,405 A | 5/1997 | Chillara | 257/668 |
| 5,627,406 A | 5/1997 | Pace | 257/700 |
| 5,633,204 A | 5/1997 | Tago et al. | 438/106 |
| 5,637,920 A | 6/1997 | Loo | 257/700 |
| 5,641,113 A | 6/1997 | Somaki et al. | 228/180.22 |
| 5,645,628 A | 7/1997 | Endo et al. | 106/1.23 |
| 5,646,067 A | 7/1997 | Gaul | 437/180 |
| 5,648,686 A | 7/1997 | Hirano et al. | 257/778 |
| 5,654,584 A | 8/1997 | Fujitsu | 257/666 |
| 5,656,858 A | 8/1997 | Kondo et al. | 257/737 |
| 5,663,598 A | 9/1997 | Lake et al. | 257/737 |
| 5,665,652 A | 9/1997 | Shimizu | 438/127 |
| 5,666,008 A | 9/1997 | Tomita et al. | 257/778 |
| 5,669,545 A | 9/1997 | Pham et al. | 228/1.1 |
| 5,674,785 A | 10/1997 | Akram et al. | 437/217 |
| 5,674,787 A | 10/1997 | Zhao et al. | 437/230 |
| 5,682,061 A | 10/1997 | Khandros et al. | 257/666 |
| 5,691,041 A | 11/1997 | Frankeny et al. | 428/209 |
| 5,722,162 A | 3/1998 | Chou et al. | 29/852 |
| 5,723,369 A | 3/1998 | Barber | 438/106 |
| 5,731,223 A | 3/1998 | Padmanabhan | 437/183 |
| 5,736,456 A | 4/1998 | Akram | 438/614 |
| 5,739,585 A | 4/1998 | Akram et al. | 257/698 |
| 5,744,859 A | 4/1998 | Ouchida | 257/668 |
| 5,757,071 A | 5/1998 | Bhansali | 257/697 |
| 5,757,081 A | 5/1998 | Chang et al. | 257/778 |
| 5,764,486 A | 6/1998 | Pendse | 361/774 |
| 5,774,340 A | 6/1998 | Chang et al. | 361/771 |
| 5,789,271 A | 8/1998 | Akram | 438/18 |
| 5,798,285 A | 8/1998 | Bentlage et al. | 438/108 |
| 5,801,072 A | 9/1998 | Barber | 438/107 |
| 5,801,447 A | 9/1998 | Hirano et al. | 257/778 |
| 5,803,340 A | 9/1998 | Yeh et al. | 228/56.3 |
| 5,804,771 A | 9/1998 | McMahon et al. | 174/255 |
| 5,808,360 A | 9/1998 | Akram | 257/738 |
| 5,811,879 A | 9/1998 | Akram | 257/723 |
| 5,817,541 A | 10/1998 | Averkiou et al. | 438/107 |
| 5,822,856 A | 10/1998 | Bhatt et al. | 29/832 |
| 5,834,844 A | 11/1998 | Akagawa et al. | 257/734 |
| 5,861,666 A | 1/1999 | Bellaar | 257/686 |
| 5,863,816 A | 1/1999 | Cho | 438/123 |
| 5,870,289 A | 2/1999 | Tokuda et al. | 361/779 |
| 5,883,435 A | 3/1999 | Geffken et al. | 257/758 |
| 5,925,931 A | 7/1999 | Yamamoto | 257/737 |
| 5,994,222 A | 11/1999 | Smith et al. | 438/689 |
| 6,012,224 A | 1/2000 | DiStefano et al. | 29/840 |
| 6,013,877 A | 1/2000 | Degani et al. | 174/264 |
| 6,018,196 A | 1/2000 | Noddin | 257/777 |
| 6,020,561 A | 2/2000 | Ishida et al. | 174/261 |
| 6,037,665 A | 3/2000 | Miyazaki | 257/773 |
| 6,046,909 A | 4/2000 | Joy | 361/748 |
| 6,084,297 A | 6/2000 | Brooks et al. | 257/698 |
| 6,084,781 A | 7/2000 | Klein | 361/771 |
| 6,103,552 A * | 8/2000 | Lin | |
| 6,103,992 A | 8/2000 | Noddin | 219/121.71 |
| 6,127,204 A | 10/2000 | Isaacs et al. | 438/106 |

OTHER PUBLICATIONS

Erickson, "Wafer Bumping: The Missing Link for DCA," Electronic Packaging & Production, Jul. 1998, pp. 43–46.

Kuchenmeister et al., "Film Chip Interconnection Systems Prepared By Wet Chemical Metallization," IEEE publication 0–7803–4526–6/98, Jun., 1998, 5 pages.

Ghaffarian, "Long Time BGA Assembly Reliability," Advancing Microelectronics, vol. 25, No. 6, Sep./Oct. 1998, pp. 20–23.

U.S. Application Serial No. 09/465,024, filed Dec. 16, 1999, entitled "Bumpless Flip Chip Assembly With Solder Via".

U.S. Application Serial No. 09/464,562, filed Dec. 16, 1999, entitled "Bumpless Flip Chip Assembly With Strips And Via–Fill".

U.S. Application Serial No. 09/464,561, filed Dec. 16, 1999, entitled "Bumpless Flip Chip Assembly With Strips–In–Via And Plating".

* cited by examiner

SEMICONDUCTOR CHIP ASSEMBLY WITH SIMULTANEOUSLY ELECTROPLATED CONTACT TERMINAL AND CONNECTION JOINT

BACKGROUND OF THE INVENTION

1. Field of the Invention

The present invention relates generally to a semiconductor chip assembly, and more particularly to a semiconductor chip assembly in which a semiconductor chip is electrically connected to a support circuit by electroplated connection joints.

2. Description of the Related Art

Semiconductor chips have input/output pads that must be connected to external circuitry in order to function as part of an electronic system. The connection media is typically an array of metallic leads (e.g., a lead frame) or a support circuit (e.g., a substrate), although the connection can be made directly to a circuit panel (e.g., a mother board). Several connection techniques are widely used. These include wire bonding, tape automated bonding (TAB) and flip-chip bonding. Wire bonding is by far the most common. In this approach, wires are bonded, one at a time, from the chip to external circuitry by ultrasonic, thermocompression or thermosonic processes. TAB involves bonding gold-bumped pads on the chip to external circuitry on a polymer tape using thermocompression bonding. Both wire bonding and TAB require mechanical force such as pressure or a burst of ultrasonic vibration and elevated temperature to accomplish metallurgical welding between the wires or bumps and the designated surface.

Flip-chip bonding involves providing pre-formed solder bumps on the pads, flipping the chip so that the pads face down and are aligned with and contact matching bond sites, and melting the solder bumps to wet the pads and the bond sites. After the solder reflows it is cooled down and solidified to form solder joints between the pads and the bond sites. Organic conductive adhesive bumps with conductive fillers in polymer binders have been used in place of solder bumps, but they do not normally form a metallurgical interface in the classical sense. A major advantage of flip-chip bonding over wiring bonding and TAB is that it provides shorter connection paths between the chip and the external circuitry, and therefore has better electrical characteristics such as less inductive noise, cross-talk, propagation delay and waveform distortion. In addition, flip-chip bonding requires minimal mounting area and weight which results in overall cost saving since no extra packaging and less circuit board space are used.

While flip chip technology has tremendous advantages over wire bonding and TAB, its cost and technical limitations are significant. For instance, the cost of forming bumps on the pads is significant. In addition, an adhesive is normally underfilled between the chip and the support circuit to reduce stress on the solder joints due to thermal mismatch between the chip and the support circuit, and the underfilling process increases both manufacturing complexity and cost. Furthermore, the solder joints exhibit increased electrical resistance as well as cracks and voids over time due to fatigue from thermo-mechanical stresses. Finally, the solder is typically a tin-lead alloy and lead-based materials are becoming far less popular due to environmental concerns over disposing of toxic materials and leaching of toxic materials into ground water supplies.

Other techniques besides wire bonding, TAB and flip-chip bonding have been developed to connect chips to external circuitry without using wires, leads or bumps. Such techniques include thin film rerouting at the wafer, panel or module level, and attaching a pre-patterned substrate to the chip such that through-holes in the substrate expose the pads and selectively applying conductive material into the through-holes. Several approaches are described below.

A typical thin film routing approach includes depositing a dielectric material on the chip, providing through-holes in the dielectric material that expose the pads, providing metallization in the through-holes that contacts the pads, and providing a top layer of conductive circuitry on the dielectric material that contacts the metallization. In this manner, the additional circuitry is fabricated on the chip. Drawbacks to this approach include complicated manufacturing requirements, high cost, and chip loss if the additional circuitry is defective. In particular, since the chip or wafer provides a substrate for the additional circuitry, chips will be lost if the additional circuitry fails to achieve certain quality and yield criteria. Unpredictable chip loss has prevented the wide spread adoption of this "chip first" approach in volume production. Furthermore, if the process is not performed on wafers, the commercially available silicon wafer processing equipment may not be compatible with common tooling and handling techniques.

U.S. Pat. No. 5,407,864 discloses providing a partially assembled printed circuit board (PCB) with buried conductive traces and through-holes that expose portions of the conductive traces, attaching the PCB to the chip using an adhesive, removing portions of the adhesive exposed by the through-holes to expose the pads, depositing a blanket conductive layer over the PCB which covers the pads and sidewalls of the through-holes without filling the through-holes, depositing a blanket insulative layer over the PCB which fills the remaining space in the through-holes, polishing the PCB to remove the conductive layer and the insulative layer from the top surface, and providing circuitry at the top surface that is connected to the conductive traces. In this manner, the circuitry at the top surface is connected to the pads through the conductive traces and portions of the conductive layer in the through-holes. Since, however, the conductive layer is blanket deposited over the entire PCB, polishing is used to remove the conductive layer from the top surface of the PCB since it would otherwise short the pads together. Polishing the conductive layer is costly and time consuming. Another drawback is that the polishing completely removes the top layer of the PCB, and therefore subsequent processes such as masking, circuitization and bumping are necessary for fabricating top surface circuitry such as traces and terminals for the next level assembly.

U.S. Pat. No. 6,037,665 discloses providing a chip with solder bumped pads, providing a pre-patterned multi-layer substrate with pre-metallized through-holes aligned with the pads, filling solder from the bumped pads into the through-holes, and reflowing the solder to form solder joint connections with the pads. This approach is similar to flip-chip bonding except that the solder is filled into the through-holes instead of merely being disposed between the chip and the substrate. Drawbacks to this approach include the need to solder bump the chip as well as the disadvantages of solder joints discussed above.

U.S. Pat. No. 5,116,463 discloses attaching a multi-layer substrate to a chip that includes forming through-holes through a dielectric layer that extend to the pads and electrolessly depositing metal into the through-holes. The electroless deposition is initiated by the pads and continues until the deposited metal fills the through-holes and contacts metallization on the top surface of the substrate. Drawbacks to this approach include the need for the metallization on the top surface to provide endpoint detection and the possibility that electroless deposition on the metallization on the top surface adjacent to the top of the through-hole may close the through-hole before the electroless deposition fills the through-hole. Furthermore, avoiding such premature closing of the through-hole imposes design constraints on the diameter of the through-hole and the thickness of the substrate which may be burdensome in some applications.

Electroplating provides deposition of an adherent metallic coating onto a conductive object placed into an electrolytic bath composed of a solution of the salt of the metal to be plated. Using the terminal as an anode (possibly of the same metal as the one used for plating), a DC current is passed through the solution affecting transfer of metal ions onto the cathode surface. As a result, the metal continually electroplates (i.e., deposits or grows) on the cathode surface. Electroplating using AC current has also been developed. Electroplating is relatively easy to control and creates far less stress on the plated surface than electroless plating.

Electroplating has been used to connect wire and TAB leads to pads on chips. For instance, U.S. Pat. No. 5,556,810 discloses inner leads laminated by an organic film and attached to a chip by an adhesive. Distal ends of the inner leads are positioned near the pads and then electrically connected to the pads by L-shaped electroplated metal. However, since the inner leads are flexible and vary in height and length, the inner leads may not be positioned precisely and uniformly, the gaps between the distal ends and the respective pads can vary, and consequently the electroplated joints may be weak or open. Furthermore, if the chip has moderate to high pad density and a separate power/ground plane is needed to achieve better electrical performance, the single layer inner leads may not be suitable. In addition, handling of this leaded-chip for the next level assembly such as outer lead bonding or board level assembly can be problematic since the leads are soft and easily bent, rendering it difficult to maintain co-planarity among the leads during the next level assembly.

U.S. Pat. No. 5,665,652 addresses the gap variations between the inner leads and the pads by positioning the inner leads at designated locations before the electroplating starts. In this approach, columnar leads are inserted into guide holes of a guide tool on the surface of the chip, and each guide hole is aligned with one of the pads. The chip and guide tool are then soaked in an electrolytic solution during electroplating. Since the inner leads can be brought into reliable contact with the pads during electroplating, control of the electroplated connections is improved. However, a drawback of this approach is the difficult and time consuming nature of mechanically attaching and aligning the guide tool to chip as well as maintaining its precisely-aligned position throughout the electroplating process. The gap between the guide tool and the chip needs to be rigidly maintained. If the gap is too large, the guided inner leads may tilt and bend; if the gap is too small, insufficient electrolytic solution can lead to electrical field shielding and inadequate electroplating. Furthermore, since the guide tool is temporarily attached to the chip, it must be subsequently detached from the chip leaving the inner leads standing free. As a result, board level assembly of this leaded-chip can have high yield loss.

Recent introduction of grid array packaging (e.g., ball grid arrays), chip size packages (CSP) and flip-chip packages using high density interconnect substrates are relentlessly driving increased printed circuit board density. Shrinking traces and spaces and increasing layer count increase printed circuit board density, however reducing the size of plated through-holes can even more significantly increase printed circuit board density. Small through-holes allow more routing space so that more conductive lines can be placed between the through-holes. Small through-holes also increase design flexibility and reduce design cycle time and overall product introduction time.

Conventional printed circuit boards have drilled through-holes with a size (diameter) in the range of 200 to 400 microns. As drilling technology improves, the drilled through-hole size is anticipated to reach 100 microns. Moreover, recently developed methods for forming through-holes using a punch, plasma or laser have driven down through-hole size to the range of 50 microns or less. A typical chip pad has a length and width on the order of 50 to 100 microns. Since the through-holes allow the pads to interconnect with various circuitry layers, using through-holes with similar sizes to the pads is desirable. The major advantage of using metallization in through-holes to interconnect the pads is that it replaces external media such as wires, bumps and leads.

The semiconductor chip assembly is subsequently connected to another circuit such as a PCB or mother board during next level assembly. Different semiconductor assemblies are connected to the next level assembly in different ways. For instance, ball grid array (BGA) packages contain an array of solder balls, and land grid array (LGA) packages contain an array of metal pads that receive corresponding solder traces on the PCB. However, since BGA and LGA packages are connected to the PCB by solder joints, the compliance is small and solder joint reliability problems exist. BGA and LGA packages have been designed with pillar post type contact terminals that extend above the package and act as a stand-off or spacer between the package and the PCB in order to absorb thermal stresses and reduce solder joint fatigue. Plastic quad flat pack (PQFP) packages have a lead frame formed into a gull-wing shape. When the PQFP is assembled on a PCB, this gull-wing lead serves as the contact terminal which provides compliance and reduces stress on the solder joints. However, drawbacks to PQFP packages include the large size of the lead and poor high frequency electrical characteristics.

In view of the various development stages and limitations in currently available semiconductor chip assemblies, there is a need for a semiconductor chip assembly that is cost-effective, reliable, manufacturable, provides excellent mechanical and electrical performance, and complies with stringent environmental standards.

SUMMARY OF THE INVENTION

An object of the present invention is to provide a semiconductor chip assembly with a chip and a support circuit that provides a low cost, high performance, high reliability package.

Another object of the present invention is to provide a method for manufacturing a semiconductor chip assembly in which a contact terminal on a top surface of a support circuit and a connection joint in a through-hole in the support circuit that connects a conductive trace in the support circuit to a pad on the chip are simultaneously formed by electroplating.

A further objective of the present invention is to provide a convenient, cost-effective method for manufacturing semiconductor chip assemblies as chip size packages, ball grid arrays or other structures.

In accordance with one aspect of the invention, a semiconductor chip assembly includes a semiconductor chip with a conductive pad and a support circuit with an insulative base, a conductive trace and a through-hole. The support circuit includes top and bottom surfaces, the through-hole includes a top sidewall portion adjacent to the top surface and a bottom sidewall portion adjacent to the bottom surface, and the conductive trace includes a pillar at the top surface and a routing line at the bottom sidewall portion. An electroplated contact terminal is on the pillar, and an electroplated connection joint in the through-hole contacts the routing line and the pad. In this manner, the conductive trace and the connection joint provide an electrical connection between the contact terminal and the pad.

Preferably, an insulative adhesive is disposed between an upper surface of the chip and the bottom surface of the support circuit, the connection joint extends through an opening in the adhesive, the connection joint covers the bottom sidewall portion and a portion of the pad directly beneath the through-hole, and the conductive trace and the connection joint provide all horizontal and vertical routing between the contact terminal and the pad.

In accordance with another aspect of the invention, a method of manufacturing the semiconductor chip assembly includes simultaneously electroplating the contact terminal and the connection joint.

Preferably, the method includes disposing the adhesive between the upper surface and the bottom surface, thereby mechanically attaching the chip to the support circuit such that the pad is aligned with the through-hole and covered by the adhesive, removing a portion of the adhesive exposed by the through-hole to form an opening in the adhesive, thereby exposing the pad without electrically connecting the pad to the conductive trace, connecting an electroplating bus to the conductive trace without connecting the electroplating bus to the pad, then simultaneously electroplating the contact terminal on the pillar and the connection joint inside the through-hole on the routing line without electroplating on the pad and without electroplating on the top sidewall portion, and then, after the connection joint extends through the opening and contacts the pad, simultaneously electroplating the contact terminal on the pillar and the connection joint inside the through-hole on the routing line and the connection joint on the pad without electroplating the top sidewall portion.

An advantage of the present invention is that the semiconductor chip assembly need not include wire bonds, TAB leads or solder joints. Another advantage is that the assembly can be manufactured using low temperature processes which reduces stress and improves reliability. A further advantage is that the assembly can be manufactured using well-controlled wet chemical processes which can be easily implemented by circuit board, lead frame and tape manufacturers. Still another advantage is that the assembly can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

FIGS. 1A–1G and 2A–2G are cross-sectional and top views, respectively, of a method of manufacturing a semiconductor chip assembly in accordance with an embodiment of the present invention.

Figure 1A:
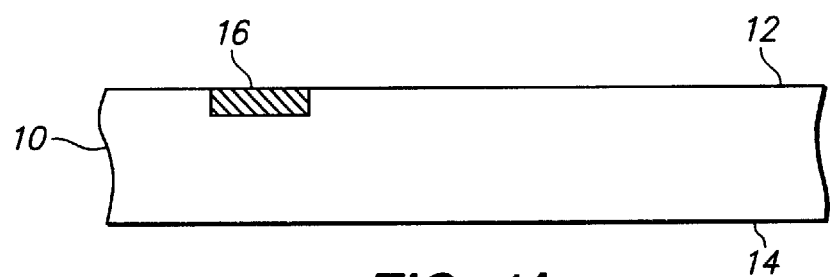
FIGS. 1A–1G are cross-sectional views showing a method of manufacturing a semiconductor chip assembly in accordance with an embodiment of the present invention.
Figure 2A:
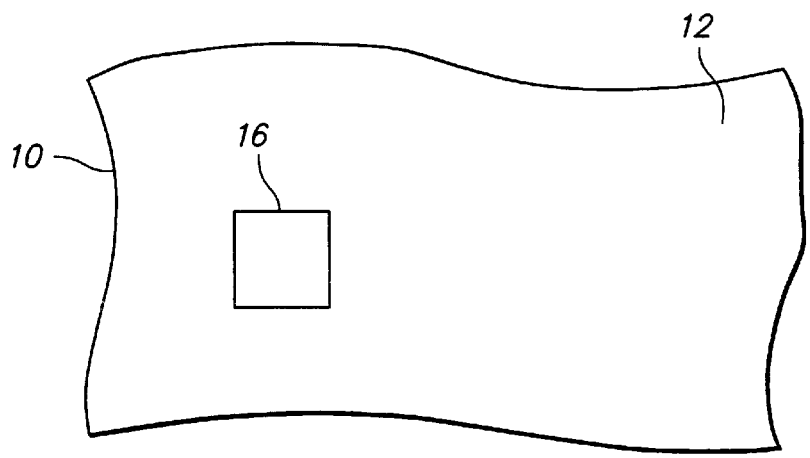
FIGS. 2A–2G are top plan views corresponding to FIGS. 1A–1G, respectively.

FIGS. 1A and 2A are cross-sectional and top views, respectively, of semiconductor chip 10 in which various transistors, circuits, interconnect lines and the like are formed (not shown). Chip 10 includes upper surface 12 and lower surface 14. Upper surface 12 includes conductive pad 16. Pad 16 is substantially aligned with the insulative housing of chip 10 so that upper surface 12 is essentially flat. Alternatively, if desired, pad 16 can extend above or be recessed below the insulative housing. Pad 16 provides a bonding site to electrically couple chip 10 with external circuitry. Thus, pad 16 can be an input/output pad or a power/ground pad. Pad 16 is adapted to receive a subsequently electroplated metal, as described below. Preferably, pad 16 has an aluminum base, a thin surface layer adapted to receive an electroplated metal, and an adhesive layer between the surface layer and the aluminum base. For instance, pad 16 includes a 500 angstrom thick gold surface layer that provides a deposition site for subsequently electroplated copper, and a 700 angstrom thick adhesive layer of titanium and titanium tungsten between the gold surface layer and the aluminum base. If desired, a 500 angstrom thick nickel barrier layer may be disposed between the gold surface layer and the titanium and titanium tungsten layer. Alternatively, pad 16 can have a different surface layer, such as nickel or palladium, to provide a deposition site for another electroplated metal. Preferably, the aluminum base of pad 16 is cleaned by dipping chip 10 in an alkaline solution containing 0.05 M phosphoric acid at room temperature for 1 minute and then rinsed in distilled water before depositing the next layer on the aluminum base. The surface layer and any additional layers (below the surface layer and above the aluminum base) can be sputter deposited on chip 10 and then patterned using photolithography. Pad 16 has a length and width of the same size in the range of 20 to 100 microns. Chip 10 includes many other pads on upper surface 12, and only pad 16 is shown for convenience of illustration.

Figure 1B:
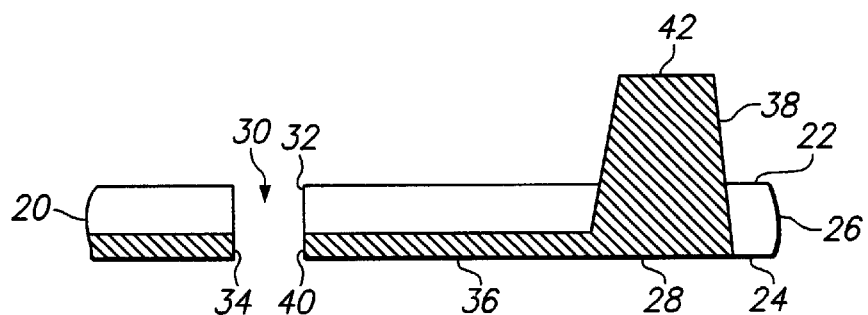
Figure 2B:
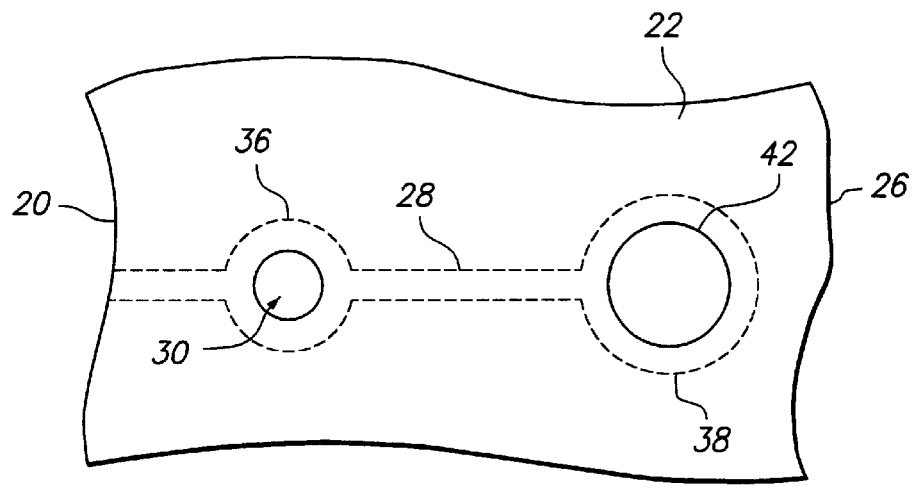

FIGS. 1B and 2B are cross-sectional and top views, respectively, of support circuit 20 which is adapted to be mechanically and electrically coupled to chip 10 to form a semiconductor chip assembly. Support circuit 20 includes top surface 22 and bottom surface 24. Support circuit 20 also includes insulative base 26, conductive trace 28, and through-hole 30. Conductive trace 28 is embedded in base 26 and through-hole 30 extends through support circuit 20. Conductive trace 28 may function as a signal, power or ground layer depending on the purpose of pad 16. Through-hole 30 includes top sidewall portion 32 adjacent to top surface 22 and bottom sidewall portion 34 adjacent to bottom surface 24. Top sidewall portion 32 is formed by base 26 alone, and therefore does not contain an electrical conductor. Conductive trace 28 includes routing line 36 and pillar 38. Routing line 36 is connected to pillar 38, disposed below top surface 22, and forms part of bottom surface 24.

Bottom sidewall portion 34 includes routing line 36. Thus, through-hole 30 extends through base 26 at top surface 22 and through routing line 36 at bottom surface 24. As a result, routing line 36 includes ring-shaped plating region 40 exposed by through-hole 30 at bottom sidewall portion 34. Plating region 40 spans the full 360 degrees around bottom sidewall portion 34. Pillar 38 includes a column-shaped plating region 42 which extends above base 26. Pillar 38 tapers slightly such that the diameter of its top surface is slightly less than the diameter of its bottom surface. The taper provides increased mechanical strength near the top surface of base 26 which is desirable during next level assembly. Top surface 22 includes base 26 and pillar 38. Therefore, top surface 22 is bumped or spiked whereas bottom surface 24 is flat. In addition, through-hole 30 is horizontally offset from pillar 38, and routing line 36 provides horizontal routing (fan-in or fan-out) between through-hole 30 and pillar 38.

Preferably, base 26 is composed of an epoxy compound that includes an epoxy resin, a curing agent, an accelerator and a silica filler and has a thickness of 25 to 50 microns, conductive trace 28 is composed of copper, routing line 36 has a width of 10 to 100 microns and a thickness of 10 to 40 microns, pillar 38 has a diameter of 300 to 500 microns that decreases with increasing height, a height of 150 to 300 microns and extends 100 to 250 microns above base 26, and through-hole 30 has a diameter of 50 to 100 microns. Base 26 may be rigid or flexible, and may be formed from numerous organic or inorganic insulators such as tape (polyimide), epoxy, silicone, glass (aramid) and ceramic. Organic insulators are preferred for low cost, high dielectric applications, whereas inorganic insulators are preferred when high thermal dissipation and a matched thermal coefficient of expansion are important. Likewise, conductive trace 28 can be composed of a wide variety of electrically conductive materials.

Support circuit 20 includes other conductive traces and through-holes in base 26, and only conductive trace 28 and through-hole 30 are shown for convenience of illustration. The other conductive traces and through-holes are matched in one-to-one correspondence. Each conductive trace includes a routing line and a pillar, the routing line includes a plating region at the bottom sidewall portion of a corresponding through-hole, and the pillar includes a plating region that extends above base 26, as described above. Likewise, each through-hole extends through base 26 and a corresponding routing line and contains top and bottom sidewall portions as described above. In addition, the conductive traces are electrically isolated from one another by base 26 except for a plating bus and related circuitry that shall be subsequently disconnected or severed.

Support circuit 20 can be manufactured in a variety of ways. For instance, in a conventional approach, a copper foil is laminated on a disposable substrate that provides a release sheet which can be easily removed when desired, the copper foil is patterned using photolithography to form routing line 36, a solder mask is blanket deposited on routing line 36 and the substrate to form base 26, a via is formed in base 26 that extends from the top surface of base 26 to a top surface of routing line 36, pillar 38 is selectively deposited on the portion of routing line 36 exposed by the via by electroplating copper and grows upwardly to fill and extend above the via, through-hole 30 is formed in base 26 and routing line 36, and the substrate is removed. A drawback to this conventional approach is the difficulty with forming pillar 38 with a suitable taper extending above base 26. Another approach to forming support circuit 20 is described in U.S. application Ser. No. 09/643,213, filed Aug. 22, 2000 by Charles W. C. Lin entitled "Method of Making a Support Circuit for a Semiconductor Chip Assembly" which is incorporated by reference.

Figure 1C:
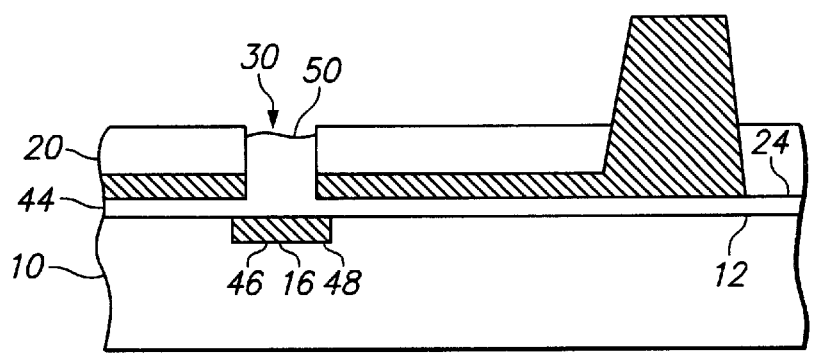
Figure 2C:
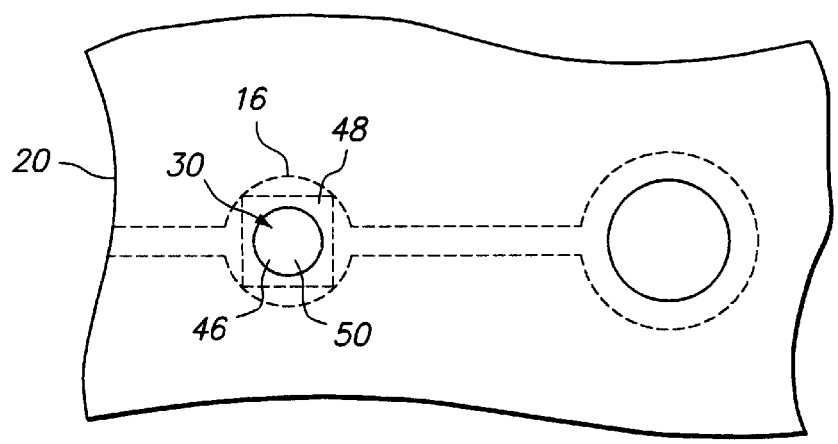

FIGS. 1C and 2C are cross-sectional and top views, respectively, of chip 10 mechanically attached to support circuit 20 by adhesive 44. Adhesive 44 is an electrical insulator disposed between and contacting upper surface 12 of chip 10 and bottom surface 24 of support circuit 20. Thus, chip 10 and support circuit 20 do not contact one another. Adhesive 44 is first applied to bottom surface 24, and then the combination of support circuit 20 and adhesive 44 is applied to upper surface 12. Alternatively, adhesive 44 can be applied to upper surface 12 and then attached to bottom surface 24. Adhesive 44 is applied as an adhesive paste such as Ablestik ABELBOND 961-2™. Alternatively, adhesive 44 can be a laminated layer or a liquid applied by screen-printing, spin-on, or spray-on. Preferably, adhesive 44 is sandwiched between upper surface 12 and bottom surface 24 using relatively low pressure while adhesive 44 is a paste, which causes adhesive 44 to fill a substantial portion of through-hole 30. Thereafter, adhesive 44 is cured or hardened at relatively low temperature in the range of 100–300° C. to form a solid adhesive layer that is 1 to 40 microns thick and mechanically fastens chip 10 to support circuit 20. Furthermore, while adhesive 44 is a paste, chip 10 and support circuit 20 are positioned relative to one another so that pad 16 is aligned with through-hole 30. That is, at least a portion of pad 16, and preferably a majority of pad 16, is directly beneath through-hole 30. Since the length and width of pad 16 slightly exceed the diameter of through-hole 30, all of pad 16 cannot be directly beneath through-hole 30. Instead, central portion 46 of pad 16 is directly beneath through-hole 30 and peripheral portion 48 of pad 16 is outside through-hole 30. Pad 16 and through-hole 30 can be aligned using an automated pattern recognition system. At this stage, adhesive 44 covers all of pad 16, portion 50 of adhesive 44 is exposed by through-hole 30, and no portion of pad 16 is exposed. Likewise, pad 16 is not electrically connected to conductive trace 28, which is separated from pad 16 by the thickness of adhesive 44.

Figure 1D:
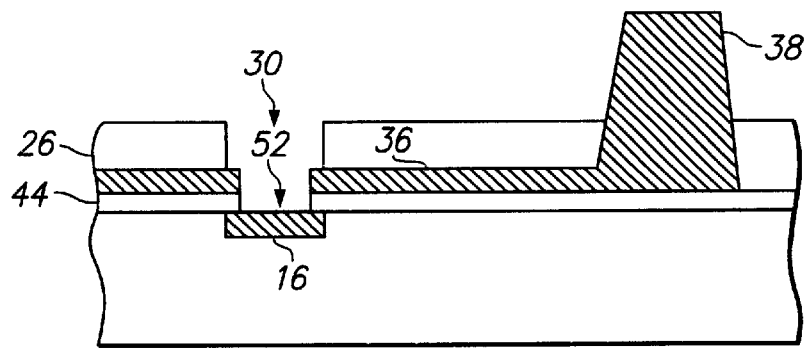
Figure 2D:
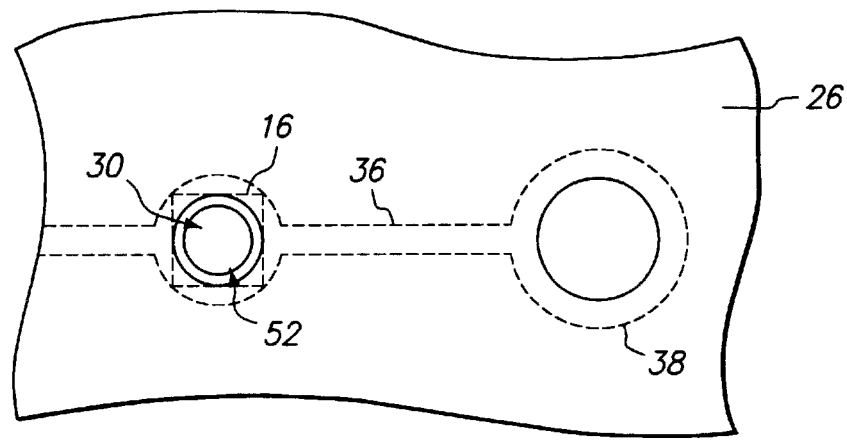

FIGS. 1D and 2D are cross-sectional and top views, respectively, of the partially completed assembly after portion 50 of adhesive 44 is removed. In particular, portion 50 of adhesive 44 is selectively removed so that pad 16 is exposed by through-hole 30. That is, at least a portion of pad 16, and preferably most of pad 16, is now exposed. This can be achieved by applying a suitable etch that is highly selective of adhesive 44 with respect to pad 16 and routing line 36. The preferred etch depends on the relative thickness of base 26 and adhesive 44. Most etches exhibit little or no selectivity of adhesive 44 with respect to base 26. That is, adhesive 44 and base 26 etch at about the same rate. If base 26 is relatively thick, a blanket plasma etch can be applied to remove portion 50 of adhesive 44 and also remove a thin upper portion of base 26, thereby increasing the distance that pillar 38 extends above base 26 without substantially changing base 26. In the current embodiment, base 26 is relatively thin, so applying a blanket plasma etch to remove portion 50 of adhesive 44 might also remove most or all of base 26. In this instance, a selective laser etch using a metal mask to target the laser at portion 50 of adhesive 44 is preferred. The laser etch removes portion 50 of adhesive 44 and also removes a small portion of base 26 near portion 50 of adhesive 44 due to registration and alignment inaccuracies, thereby slightly increasing the size of through-hole 30 above routing line 36 and exposing a small portion of routing line 36 that was previously covered by base 26. As a result, opening 52 is formed in adhesive 44 without damaging pad 16 or routing line 36. Opening 52 is aligned with through-hole 30 and provides an extension or pattern transfer of through-hole 30 through adhesive 44 to pad 16.

Figure 1E:
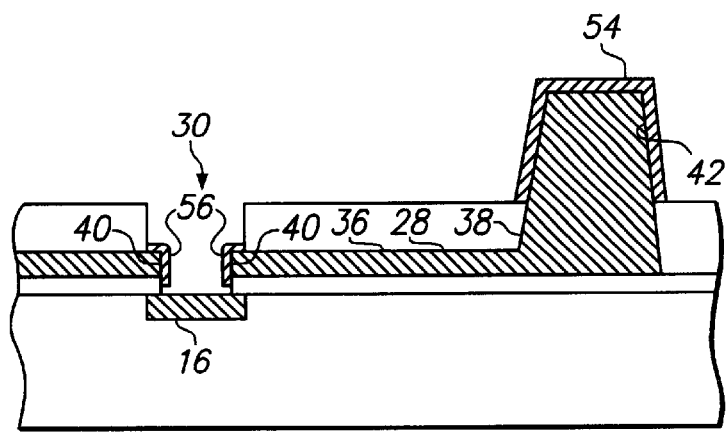
Figure 2E:
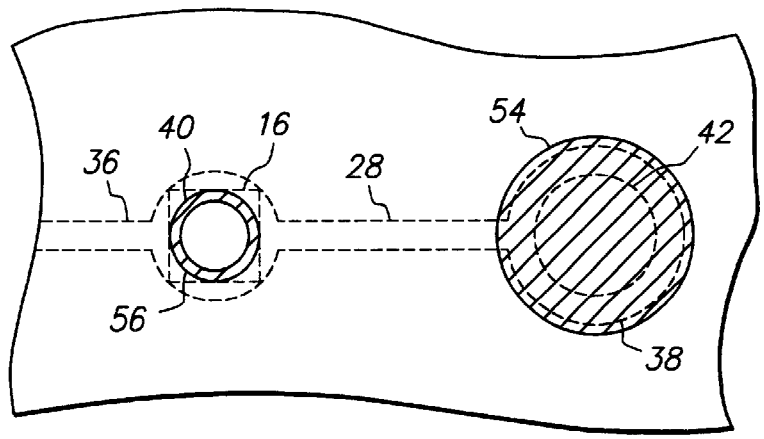

FIGS. 1E and 2E are cross-sectional and top views, respectively, of the partially completed assembly during the initial stage of an electroplating operation. At this initial stage, conductive trace 28 is connected to a plating bus (not shown), current is applied to the plating bus from an external power source, and the partially completed assembly is submerged in an electrolytic copper plating bath such as Sel-Rex CUBATH M™ at room temperature. Therefore, plating region 40 of routing line 36 inside through-hole 30, and plating region 42 of pillar 38 above base 26, are connected to the plating bus and exposed to the electrolytic bath. As a result, contact terminal 54 begins to plate (or grow) on plating region 42, and simultaneously, connection joint 56 begins to plate inside through-hole 30 on plating region 40. Since pad 16 is not connected to the plating bus, no plating occurs on pad 16. Although contact terminal 54 and connection joint 56 are copper, it is understood that a wide variety of plating metals can be employed, including copper, gold, nickel, palladium, tin, alloys thereof, and combinations thereof.

Figure 1F:
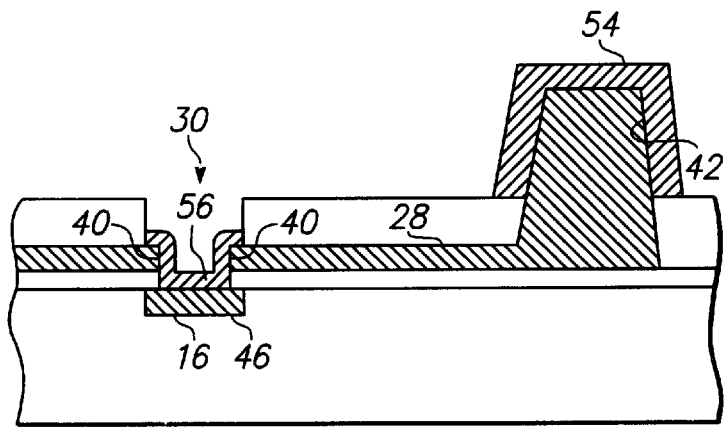
Figure 2F:
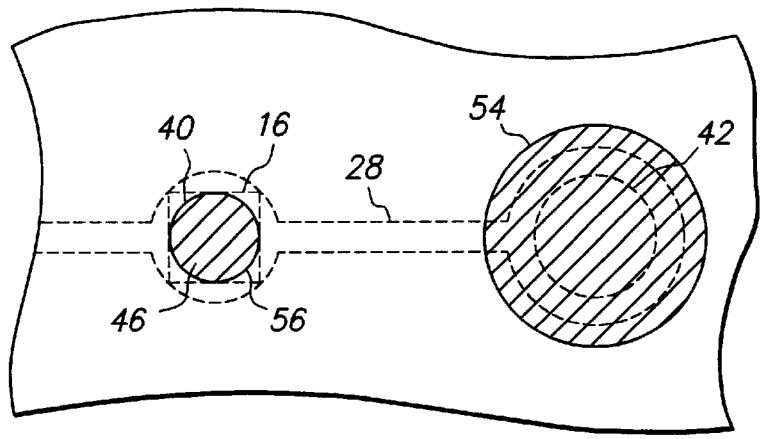

FIGS. 1F and 2F are cross-sectional and top views, respectively, of the partially completed assembly during an intermediate stage of the electroplating operation. As during the initial stage, conductive trace 28 receives current from the plating bus and the partially completed assembly is submerged in the electrolytic copper plating bath. As a result, contact terminal 54 continues to plate on plating region 42, and simultaneously, connection joint 56 continues to plate inside through-hole 30 on plating region 40. At this stage, unlike the initial stage, connection joint 56 extends through opening 52 and contacts pad 16. As a result, pad 16 is connected to the plating bus via connection joint 56 and conductive trace 28, and therefore connection joint 56 also begins to plate on pad 16. Connection joint 56 initially contacts a region of pad 16 directly beneath through-hole 30 that is adjacent to the sidewall of opening 52 without contacting a more central region of pad 16 that is spaced from the sidewall of opening 52 and directly beneath through-hole 30. Advantageously, after the initial contact is made, connection joint 56 begins to plate on the entire central region 46 of pad 16, thereby providing a more robust electrical connection.

Figure 1G:
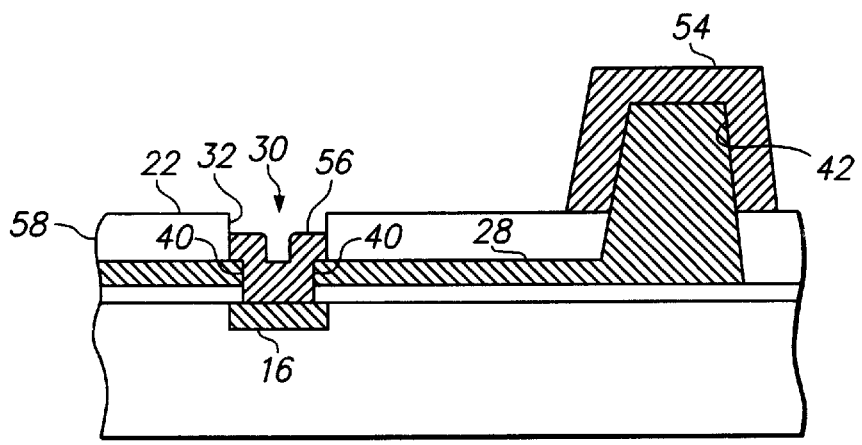
Figure 2G:
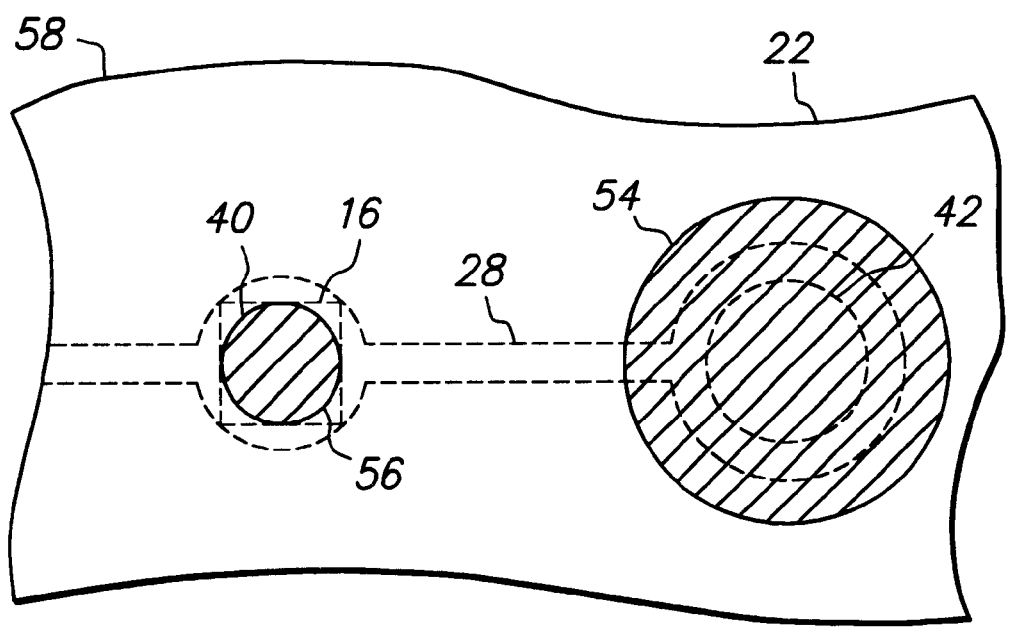

FIGS. 1G and 2G are cross-sectional and top views, respectively, of the completed assembly 58 during a final stage of the electroplating operation. As during the initial and intermediate stages, conductive trace 28 receives current from the plating bus and the assembly is submerged in the electrolytic copper plating bath. As a result, contact terminal 54 continues to plate on plating region 42, and simultaneously, connection joint 56 continues to plate on plating region 40 and on pad 16. At the completion of the electroplating operation, contact terminal 54 has a thickness in the range of 150 to 200 microns and provides a bumped bonding site for the next level assembly. In addition, connection joint 56 has a thickness in the range of 10 to 50 microns and provides a robust, permanent electrical connection between pad 16 and conductive trace 28. Connection joint 56 has a bowl-like shape that completely covers central region 46 of pad 16, bottom sidewall portion 34, and plating region 40. On the other hand, connection joint 56 does not extend to top surface 22 or top sidewall portion 32. In fact, top sidewall portion 32 continues to be exposed and devoid of electroplated metal or any other conductive material. Thus, connection joint 56 is the only electrical conductor in through-hole 30. After assembly 58 is removed from the electrolytic bath it is rinsed in distilled water to remove contaminants.

Figure 3:
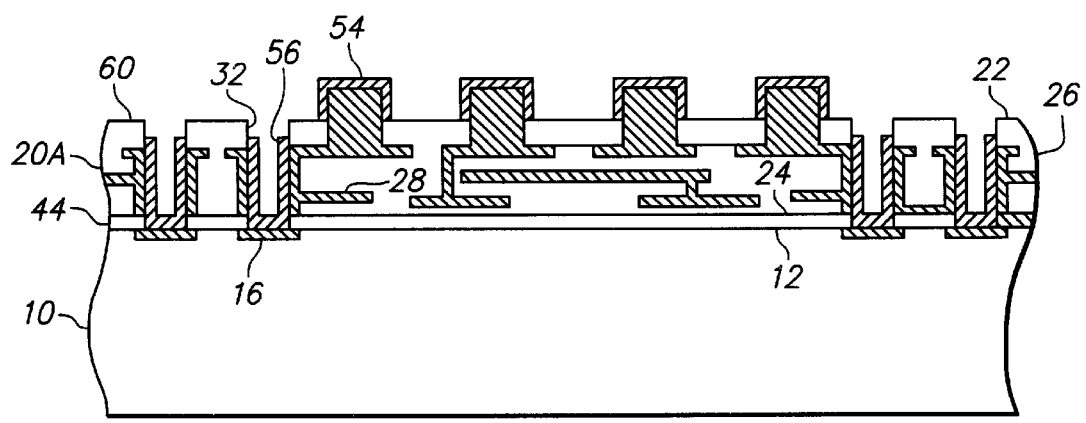
FIG. 3 is a cross-sectional view of a semiconductor chip assembly in accordance with another embodiment of the present invention.

FIG. 3 is a cross-sectional view of semiconductor chip assembly 60 in accordance with another embodiment of the present invention. As is seen, assembly 60 employs a multi-layer support circuit 20A composed of multiple insulating layers and multiple wiring layers.

The semiconductor chip assemblies described above are merely exemplary. Numerous other embodiments are contemplated. For instance, the conductive trace can have various shapes and sizes. The conductive trace, contact terminal and connection joint can be various conductive metals including copper, gold, nickel, palladium, tin, combinations thereof, and alloys thereof. Of common metallic materials, copper has especially low resistivity and cost. Furthermore, those skilled in the art will understand that in the context of a support circuit, a copper conductive trace is typically a copper alloy that is mostly copper but not pure elemental copper, such copper-zirconium (99.9% copper), copper-silver-phosphorus-magnesium (99.7% copper), or copper-tin-iron-phosphorus (99.7% copper). It is generally desirable to protect electroplated copper with another electroplated metal such as nickel, palladium or gold.

The support circuit can be single or multi-layer printed circuit board, a lead frame, a tape, a glass panel, or a ceramic hybrid. The conductive trace need not necessarily extend above the top surface of the base, and the plating region upon which the contact terminal is formed can be a ball, a pad, or a pillar (columnar post). A pillar is particularly well-suited for reducing thermal mismatch related stress in the assembly.

The pad can have numerous shapes including a flat rectangular shape and a bumped shape. For instance, a bump-shaped pad may extend into the through-hole and may even extend above the plating region of the routing line. The pad can either be partially or completely exposed by the through-hole prior to the electroplating operation. The pad can have a length and width that are larger than, equal to, or smaller than the diameter of the through-hole. Preferably, the pad and through-hole have the same or similar size, and essentially all of the pad is directly beneath the through-hole. The pillar, which prior to the electroplating operation is part of the top surface of the support circuit, may extend above, be aligned with, or be recessed with respect to the top surface of the base, either before or after an etch is applied that removes the exposed portion of the adhesive and a top portion of the base. Likewise, the contact terminal, which is part of the top surface of the support circuit, may extend above, be aligned with, or be recessed with respect to the top surface of the base. The through-hole, as well as the pillar, can have a circular, ovular, square, rectangular or other shape (as viewed from the top surface of the support circuit). Preferably, the plating region of the routing line spans the full 360 degrees around the through-hole although this is not essential. The through-hole may be formed completely or partially either before or after mechanically attaching the chip to the support circuit. See, for instance, U.S. application Ser. No. 09/643,445, filed Aug. 22, 2000 by Charles W. C. Lin entitled "Method of Making a Semiconductor Chip Assembly" which is incorporated by reference. Furthermore, the through-hole sidewalls may have a wide variety of shapes and slopes including vertical sidewalls, tapered sidewalls, continuous sidewalls and stepped sidewalls.

The electroplating operation can be completed before the connection joint reaches the top surface of the base, or it can continue until the connection joint reaches the top surface of the base and/or assumes a columnar post shape. The choice between a connection joint that partially or completely fills the through-hole and between a connection joint that is bowl-shaped or column-shaped depends on design and reliability considerations. In either case, the connection joint does not electroplate the top sidewall portion. For instance, if the final stage (FIGS. 1G and 2G) of the electroplating operation continues until the connection joint fills the through-hole and covers the top sidewall portion and extends to the top surface of the base, the connection joint still does not electroplate on the top sidewall portion, and instead, only electroplates on the plating region of the routing line exposed by the through-hole and the pad. In other words, the connection joint only electroplates on the plating region of the routing line and the pad, even if it grows high enough to cover the top sidewall portion.

Furthermore, the electroplating operation need not be restricted to a single metal. For instance, the connection joint can be formed during the initial stage (FIGS. 1E and 2E) and intermediate stage (FIGS. 1F and 2F) using copper, and then, after the connection joint has begun to plate on the pad, the connection joint can be formed during the final stage (FIGS. 1G and 2G) using nickel and then palladium. In this instance, the contact terminal and the connection joint consist of a bottom layer of copper, a middle layer of nickel, and a top layer of palladium. The nickel protects the copper from corrosion, and the palladium provides wetting for the contact terminal when solder is applied to the contact terminal during the next level assembly but is of relatively little importance to the connection joint. As another example, the connection joint can be formed during the initial and intermediate stages with copper, and then the connection joint can be formed during the final stage using nickel and then solder. In this instance, the contact terminal and the connection joint consist of a bottom layer of copper, a middle layer of nickel, and a top layer of solder. The nickel protects the copper from corrosion, and the solder is used to provide solder joints for the next level assembly but is of relatively little importance to the connection joint. Thus, the connection joint may include a wide variety of electroplated metal layers, particularly where the bottom metal layer is well-suited to contacting the conductive trace and the pad, and the top metal layer is well-suited for providing a surface layer for the contact terminal that facilitates connection with the next level assembly.

The electroplating operation can also utilize a plating mask so that only selected portions of the support circuit that are connected to the plating bus are electroplated. For instance, the plating mask can expose the through-holes and the pillars while covering other conductors connected to the plating bus that would otherwise be exposed to the electrolytic bath where electroplating is not desired.

The electroplating operation may deposit elemental metals (e.g., copper and gold) or metal alloys. It is understood that electroplated metal, as used herein, encompasses elemental metals and metal alloys.

After the electroplating operation, further encapsulation is not necessary. In particular, it is not necessary to fill a conductor or insulator into whatever space remains in the through-hole. However, in the event the base is thin, it may be desirable to fill an encapsulant into whatever space remains in the through-hole to enhance the mechanical strength of the support circuit.

After the electroplating operation, a soldering material or solder ball can be deposited on the contact terminal by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly.

After the electroplating operation, the plating bus is disconnected from the conductive trace. The plating bus can be disconnected by mechanical sawing, laser cutting, chemical etching, and combinations thereof. If the plating bus is disposed about the periphery of the assembly but is not integral to the assembly, then the plating bus can be disconnected when the assembly is singulated from other assemblies. However, if the plating bus is integral to the assembly, then prior to singulation a photolithography step can be added to selectively cut related circuitry on the assembly that is dedicated to the plating bus since this circuitry would otherwise short the conductive traces together.

The working format can be a single chip, a wafer, a strip or a panel based on the manufacturing design. For instance, when the working format is a wafer, numerous semiconductor chip assemblies can be simultaneously batch manufactured on a single wafer and then separated from one another into chip size packages during singulation. As another example, when the working format is a strip (or reel-to-reel) form of the support circuit, the wafer is singulated into individual chips, the chips are individually attached to support circuits on the strip, the semiconductor chip assemblies are formed by exposing the pads and performing the electroplating operation, and then the assemblies are separated from one another by cutting the strip. Assemblies manufactured using a strip can be chip size packages, ball grid arrays, or other structures. The wafer-based approach employs fewer steps and is less time consuming than the strip-based approach, however the strip-based approach is easier to control and has better dimensional stability than the wafer-based approach since aligning the through-holes with the pads involves a single chip and a single support circuit rather than the entire wafer and numerous support circuits.

Advantageously, electroplating the chip to the support circuit in accordance with the present invention provides an assembly that is reliable and inexpensive. The connection joint is generally confined to the through-hole and related opening in the adhesive. The mode of the connection shifts from the initial mechanical coupling to metallurgical coupling to assure sufficient metallurgical bond strength. The electroplated contact terminal on the pillar yields enhanced reliability for the next level assembly that exceeds that of conventional BGA packages. Furthermore, mechanical and metallurgical coupling between the chip and the support circuit can be provided without wire bonding, TAB, flip-chip bonding, polishing, electroless plating or solder joints. Preferably, the electroplated connection joint is the only conductor in the through-hole. As a result, the present invention significantly enhances throughput, yield and performance characteristics compared to conventional packaging techniques. Moreover, the electroplating operation of the present invention is well-suited for use with materials compatible with copper chip and lead-free environmental requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

I claim:

1. A method of manufacturing a semiconductor chip assembly, comprising:

providing a semiconductor chip that includes a conductive pad;

providing a support circuit that includes an insulative base, a conductive trace, and a through-hole, wherein the support circuit includes top and bottom surfaces, the through-hole includes a top sidewall portion adjacent to the top surface and a bottom sidewall portion adjacent to the bottom surface, and the conductive trace includes a first plating region at the top surface and a second plating region at the bottom sidewall portion;

mechanically attaching the chip to the support circuit;

exposing the pad using the through-hole; and simultaneously electroplating a contact terminal on the first plating region and a connection joint between the second plating region and the pad without electroplating the top sidewall portion.

2. The method of claim 1, wherein simultaneously electroplating the contact terminal and the connection joint includes initially electroplating the contact terminal on the first plating region and the connection joint on the second plating region without electroplating the connection joint on the pad, and then also includes electroplating the connection joint on the pad after the connection joint contacts the pad.

3. The method of claim 1, wherein simultaneously electroplating the contact terminal and the connection joint includes initially electroplating a first metal that contacts the conductive trace and the pad, and then electroplating a second metal on the first metal that does not contact the conductive trace and does not contact the pad.

4. The method of claim 1, wherein the conductive trace includes a pillar and a routing line, the pillar extends above the base and is spaced from the through-hole and provides the first plating region, the contact terminal and the first plating region extend above the base, and the routing line is below the top surface and provides the second plating region.

5. The method of claim 1, wherein the top sidewall portion is formed in the base alone and is devoid of metal after the electroplating, and the bottom sidewall portion is formed in the conductive trace alone and is covered by the connection joint after the electroplating.

6. The method of claim 1, wherein the bottom sidewall portion and any portion of the pad directly beneath the through-hole are covered by the connection joint after the electroplating.

7. The method of claim 1, wherein mechanically attaching the chip to the support circuit includes contacting an insulative adhesive to an upper surface of the chip and the bottom surface, and exposing the pad includes applying an etch to remove a portion of the adhesive exposed by the through-hole.

8. The method of claim 7, wherein applying the etch removes a top portion of the base.

9. The method of claim 1, wherein the conductive trace and the connection joint provide all horizontal and vertical routing between the contact terminal and the pad.

10. The method of claim 1, wherein the assembly is a chip size package.

11. A method of manufacturing a semiconductor chip assembly, comprising:

providing a semiconductor chip with upper and lower surfaces, wherein the upper surface includes a conductive pad;

providing a support circuit with top and bottom surfaces, wherein the support circuit includes an insulative base, a conductive trace within the base, and a through-hole that extends between the top and bottom surfaces and extends through the base and the conductive trace, the through-hole includes a top sidewall portion adjacent to the top surface and a bottom sidewall portion adjacent to the bottom surface, the conductive trace includes pillar and a routing line, the top surface includes the pillar and the base, the pillar extends above the base, the top sidewall portion consists of the base, and the bottom sidewall portion includes the routing line;

disposing an adhesive between the upper surface and the bottom surface, thereby mechanically attaching the chip to the support circuit, such that the pad is aligned with the through-hole;

removing a portion of the adhesive exposed by the through-hole;

exposing the pad using the through-hole; and simultaneously electroplating a contact terminal on the pillar and a connection joint between the routing line and the pad without electroplating the top sidewall portion, wherein the connection joint initially plates inside the through-hole on the routing line without plating on the pad, and after the connection joint extends through the adhesive and contacts the pad, the connection joint also plates on the pad, thereby electrically connecting the contact terminal to the pad via the conductive trace and the connection joint.

12. The method of claim 11, wherein the connection joint covers the bottom sidewall portion and a portion of the pad directly beneath the through-hole, and the top sidewall portion remains exposed and devoid of metal after the electroplating.

13. The method of claim 11, wherein the connection joint covers the bottom sidewall portion and the top sidewall portion and a portion of the pad directly beneath the through-hole after the electroplating.

14. The method of claim 11, wherein the connection joint is bowl-shaped after the electroplating.

15. The method of claim 11, wherein the connection joint is column-shaped after the electroplating.

16. The method of claim 11, wherein disposing the adhesive includes applying a paste and curing the paste.

17. The method of claim 11, wherein removing the portion of the adhesive includes applying a laser etch.

18. The method of claim 11, wherein removing the portion of the adhesive includes simultaneously removing a top portion of the base, thereby causing the pillar to extend further above the base.

19. The method of claim 11, wherein the conductive trace and the connection joint provide all horizontal and vertical routing between the contact terminal and the pad.

20. The method of claim 11, wherein the assembly is a chip size package.

21. A method of manufacturing a semiconductor chip assembly, comprising:

providing a semiconductor chip with upper and lower surfaces, wherein the upper surface includes a conductive pad;

providing a support circuit with top and bottom surfaces, wherein the support circuit includes an insulative base, a conductive trace within the base, and a through-hole that extends between the top and bottom surfaces and extends through the base and the conductive trace, the through-hole includes a top sidewall portion adjacent to the top surface and a bottom sidewall portion adjacent to the bottom surface, the top and bottom sidewall portions are adjacent to one another, the conductive trace includes a pillar and a routing line, the top surface includes the pillar and the base, the pillar extends above the base, the top sidewall portion consists of the base, the bottom sidewall portion consists of the base and the routing line, and the routing line provides a corner between the bottom sidewall portion and the bottom surface;

disposing an insulative adhesive between the upper surface and the bottom surface, thereby mechanically attaching the chip to the support circuit, such that the pad is aligned with the through-hole;

removing a portion of the adhesive exposed by the through-hole to form an opening in the adhesive; then simultaneously electroplating a contact terminal on the pillar and a connection joint inside the through-hole on the routing line without electroplating on the pad and without electroplating on the top sidewall portion, and then, after the connection joint extends through the opening and contacts the pad;

simultaneously electroplating the contact terminal on the pillar and the connection joint inside the through-hole on the routing line and the connection joint beneath the through-hole on the pad without electroplating the top sidewall portion, thereby providing an electrical connection between the contact terminal and the pad that consists of the conductive trace and the connection joint, wherein the connection joint consists of electroplated metal and is the only electrical conductor in the through-hole.

22. The method of claim 21, wherein the routing line provides all horizontal routing between the contact terminal and the pad, and the pillar and the connection joint provide all the vertical routing between the contact terminal and the pad.

23. The method of claim 21, wherein the pad is aligned with the through-hole such that a central region of the pad is directly beneath the through-hole and a peripheral region of the pad is not directly beneath the through-hole and the connection joint does not contact the peripheral region after the electroplating.

24. The method of claim 21, wherein the contact terminal and the connection joint include a metal selected from the group consisting of copper, gold, nickel, palladium, tin, alloys thereof, and combinations thereof.

25. The method of claim 21, wherein the conductive trace includes copper, a first electroplated layer of the connection joint that contacts the conductive trace and the pad includes copper, and a second electroplated layer of the connection joint that does not contact the conductive trace and does not contact the pad excludes copper.

26. The method of claim 21, wherein contact terminal and the connection joint consist of a bottom layer that includes copper, a middle layer that includes nickel, and a top layer that includes one of palladium and solder.

27. The method of claim 21, wherein the base is an insulator selected from the group consisting of tape, epoxy, silicone, glass and ceramic.

28. The method of claim 21, wherein electroless deposition and polishing are not used after disposing the adhesive.

29. The method of claim 21, wherein the assembly is devoid of wire bonds, TAB leads, and solder joints.

30. The method of claim 21, wherein the assembly is a chip size package.

31. A method of manufacturing a semiconductor chip assembly, comprising the following steps in the sequence set forth:

providing a semiconductor chip and a support circuit, wherein the chip includes upper and lower surfaces, the upper surface includes a conductive pad, the support circuit includes top and bottom surfaces, the support circuit includes an insulative base, a conductive trace within the base, and a through-hole that extends between the top and bottom surfaces and extends through the base and the conductive trace, the through-hole includes a top sidewall portion adjacent to the top surface and a bottom sidewall portion adjacent to the bottom surface, the conductive trace includes pillar and a routing line, the top surface includes the pillar and the base, the pillar extends above the base, the top sidewall portion consists of the base, and the bottom sidewall portion includes the routing line;

disposing an adhesive between the upper surface and the bottom surface, thereby mechanically attaching the chip to the support circuit, such that the pad is aligned with the through-hole;

removing a portion of the adhesive exposed by the through-hole, thereby exposing the pad; and simultaneously electroplating a contact terminal on the pillar and a connection joint between the routing line and the pad without electroplating the top sidewall portion, wherein the connection joint initially plates inside the through-hole on the routing line without plating on the pad, and after the connection joint extends through the adhesive and contacts the pad, the connection joint also plates on the pad, thereby electrically connecting the contact terminal to the pad via the conductive trace and the connection joint.

32. The method of claim 31, wherein the connection joint covers the bottom sidewall portion and a portion of the pad directly beneath the through-hole, and the top sidewall portion remains exposed and devoid of metal after the electroplating.

33. The method of claim 31, wherein the connection joint covers the bottom sidewall portion and the top sidewall portion and a portion of the pad directly beneath the through-hole after the electroplating.

34. The method of claim 31, wherein the connection joint is bowl-shaped after the electroplating.

35. The method of claim 31, wherein the connection joint is column-shaped after the electroplating.

36. The method of claim 31, wherein disposing the adhesive includes applying a paste and curing the paste.

37. The method of claim 31, wherein removing the portion of the adhesive includes applying a laser etch.

38. The method of claim 31, wherein removing the portion of the adhesive includes simultaneously removing a top portion of the base, thereby causing the pillar to extend further above the base.

39. The method of claim 31, wherein the conductive trace and the connection joint provide all horizontal and vertical routing between the contact terminal and the pad.

40. The method of claim 31, wherein the assembly is a chip size package.

41. A method of manufacturing a semiconductor chip assembly, comprising the following steps in the sequence set forth:

providing a semiconductor chip and a support circuit, wherein the chip includes upper and lower surfaces, the upper surface includes a conductive pad, the support circuit includes top and bottom surfaces, the support circuit includes an insulative base, a conductive trace within the base, and a through-hole that extends between the top and bottom surfaces and extends through the base and the conductive trace, the through-hole includes a top sidewall portion adjacent to the top surface and a bottom sidewall portion adjacent to the bottom surface, the top and bottom sidewall portions are adjacent to one another, the conductive trace includes a pillar and a routing line, the top surface includes the pillar and the base, the pillar extends above the base, the top sidewall portion consists of the base, the bottom sidewall portion consists of the base and the routing line, and the routing line provides a corner between the bottom sidewall portion and the bottom surface;

disposing an insulative adhesive between the upper surface and the bottom surface, thereby mechanically attaching the chip to the support circuit, such that the pad is aligned with the through-hole;

removing a portion of the adhesive exposed by the through-hole to form an opening in the adhesive;

simultaneously electroplating a contact terminal on the pillar and a connection joint inside the through-hole on the routing line without electroplating on the pad and without electroplating on the top sidewall portion, and then, after the connection joint extends through the opening and contacts the pad;

simultaneously electroplating the contact terminal on the pillar and the connection joint inside the through-hole on the routing line and the connection joint beneath the through-hole on the pad without electroplating the top sidewall portion, thereby providing an electrical connection between the contact terminal and the pad that consists of the conductive trace and the connection joint, wherein the connection joint consists of electroplated metal and is the only electrical conductor in the through-hole.

42. The method of claim 41, wherein the routing line provides all horizontal routing between the contact terminal and the pad, and the pillar and the connection joint provide all the vertical routing between the contact terminal and the pad.

43. The method of claim 41, wherein the pad is aligned with the through-hole such that a central region of the pad is directly beneath the through-hole and a peripheral region of the pad is not directly beneath the through-hole and the connection joint does not contact the peripheral region after the electroplating.

44. The method of claim 41, wherein the contact terminal and the connection joint include a metal selected from the group consisting of copper, gold, nickel, palladium, tin, alloys thereof, and combinations thereof.

45. The method of claim 41, wherein the conductive trace includes copper, a first electroplated layer of the connection joint that contacts the conductive trace and the pad includes copper, and a second electroplated layer of the connection joint that does not contact the conductive trace and does not contact the pad excludes copper.

46. The method of claim 41, wherein contact terminal and the connection joint consist of a bottom layer that includes copper, a middle layer that includes nickel, and a top layer that includes one of palladium and solder.

47. The method of claim 41, wherein the base is an insulator selected from the group consisting of tape, epoxy, silicone, glass and ceramic.

48. The method of claim 41, wherein electroless deposition and polishing are not used after disposing the adhesive.

49. The method of claim 41, wherein the assembly is devoid of wire bonds, TAB leads, and solder joints.

50. The method of claim 41, wherein the assembly is a chip size package.

* * * * *

UNITED STATES PATENT AND TRADEMARK OFFICE
CERTIFICATE OF CORRECTION

PATENT NO. : 6,350,633 B1
DATED : February 26, 2002
INVENTOR(S) : Charles W.C. Lin It is certified that error appears in the above-identified patent and that said Letters Patent is hereby corrected as shown below:

Column 14,
Line 9, insert -- a -- before "pillar".

Column 16,
Line 11, insert -- a -- before "pillar".

Signed and Sealed this

First Day of July, 2003

JAMES E. ROGAN
*Director of the United States Patent and Trademark Office*